(12) United States Patent
Mahanpour

(10) Patent No.: US 6,227,941 B1
(45) Date of Patent: May 8, 2001

(54) SUPPORT STRUCTURE WITH MULTI-LAYER SUPPORT MATERIAL FOR USE DURING PACKAGE REMOVAL FROM A MULTI-LAYER INTEGRATED CIRCUIT DEVICE

(75) Inventor: Mehrdad Mahanpour, Union City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/193,371

(22) Filed: Nov. 17, 1998

(51) Int. Cl.[7] ....................................................... B24B 1/00
(52) U.S. Cl. ............................. 451/28; 451/41; 451/386; 451/391
(58) Field of Search ............................... 451/41, 28, 386, 451/391, 38

(56) References Cited

U.S. PATENT DOCUMENTS 5,455,455 * 10/1995 Badehi ................................. 257/690
5,904,489 * 5/1999 Khosropour et al. .................. 438/15

* cited by examiner

*Primary Examiner*—Derris H. Banks
*Assistant Examiner*—Shantese McDonald
(74) *Attorney, Agent, or Firm*—Sawyer Law Group LLP

(57) ABSTRACT

Aspects for supporting a package and a device coupled to the package at a device frontside during package removal are described. In an exemplary aspect, a support structure includes a support frame supporting the package substantially near end portions of the package, and multi-layer support material provided within the support frame, wherein breakage of the package during grinding of the package at its backside is reduced. The multi-layer support material further includes a hard wax layer substantially covering the device, an epoxy glue layer substantially covering the hard wax layer, and a soft wax layer substantially covering the epoxy glue layer and substantially filling remaining space within the support frame.

15 Claims, 2 Drawing Sheets

SUPPORT STRUCTURE WITH MULTI-LAYER SUPPORT MATERIAL FOR USE DURING PACKAGE REMOVAL FROM A MULTI-LAYER INTEGRATED CIRCUIT DEVICE

FIELD OF THE INVENTION

The present invention relates to multi-layer integrated circuit (IC) devices, and more particularly to a support structure for use during package removal from multi-layer IC devices attached at a frontside to the packages.

BACKGROUND OF THE INVENTION

For multi-layer IC devices attached at a frontside to packaging, e.g., oriented in a flip-chip orientation, debugging for defects in the IC is difficult due to having to approach the desired layers from the backside of the device. FIG. 1 illustrates a sideview block diagram of a typical flip-chip configuration. As shown in FIG. 1, an IC device 10 is coupled to a ceramic package 12 (e.g., a C4 package) via solder bumps 14. The solder bumps 14 act as chip-to-carrier interconnects to attach the IC device 10 to the ceramic package 12 and to mate with corresponding pad patterns to form the necessary electrical contacts between the circuit(s) of the IC device 10 and pins of the package 12.

Testing of the circuit remains a challenge due to the upside-down nature of the flip-chip orientation. While the circuit may be approached through the backside layers, such techniques are usually not preferred due to the difficulties associated with having to access the layers in an unconventional order. Further, these techniques normally reduce the thickness of the device to reach the circuit, making the device extremely fragile and cumbersome to handle and utilize during testing. Other attempts involve removal of the package to allow testing from a frontside. However, package removal techniques also carry a risk of device damage when trying to overcome the strong solder bond between the device and the package. Other techniques try to reduce the thickness of the package to assist in the package removal. Unfortunately, these techniques suffer the risk of package breakage.

Accordingly, a need exists for a structure that supports a device during a separation procedure that reduces risk of damage. The present invention addresses such a need.

SUMMARY OF THE INVENTION

The present invention provides aspects for supporting a package and a device coupled to the package at a device frontside during package removal. In an exemplary aspect, a support structure includes a support frame supporting the package substantially near end portions of the package, and multi-layer support material provided within the support frame, wherein breakage of the package during grinding of the package at its backside is reduced. The multi-layer support material further includes a hard wax layer substantially covering the device, an epoxy glue layer substantially covering the hard wax layer, and a soft wax layer substantially covering the epoxy glue layer and substantially filling remaining space within the support frame.

Through the present invention, reduced risk of package breakage is achieved during grinding. These and other advantages of the aspects of the present invention will be more fully understood in conjunction with the following detailed description and accompanying drawings.

DETAILED DESCRIPTION

The present invention relates to a support structure for integrated circuit devices coupled at a frontside to a package during package removal. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 2:
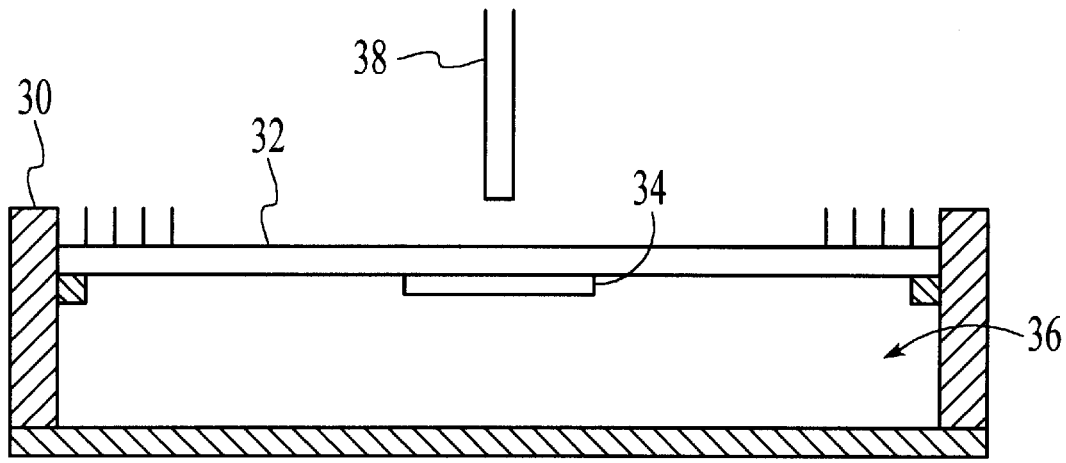
FIG. 2 illustrates a sideview of a prior art support structure and device arrangement used during grinding removal of a package from a device coupled at its frontside to the package.

A prior art support structure is illustrated in FIG. 2. The structure includes a support frame 30 for holding the package 32. Between the device 34 and support frame 30, soft wax 36 is conventionally used to further support the device 34 and package 32. The structure allows use of a milling tool 38, such as a Chip-Unzip machine from Hypervision of Fremont, Calif. to grind away a portion of the ceramic package 32 attached to the device 34. As the package 32 is thinned down by the milling tool 38, heat created by friction tends to soften the wax 36. The whole package assembly then bends and cracks at the thinned package layer 32. Separation of the package 32 from the device 34 is extremely hindered once the cracking occurs.

Figure 3:
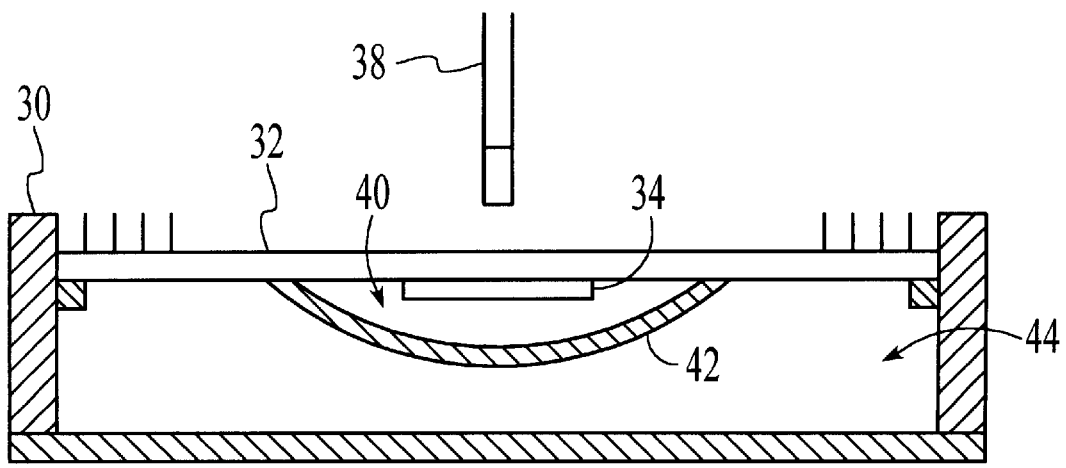
FIG. 3 illustrates sideview diagram of a support structure arrangement in accordance with present invention.

In accordance with the present invention, an improved support structure is provided that reduces the risk of breakage and device damage. FIG. 3 illustrates a diagram of the improved support structure. In the arrangement of FIG. 3, the support frame 30 is utilized, as in the prior art. However, multi-layer support material is provided. Thus, a hard wax layer 40 and epoxy glue layer 42 are used, along with a soft wax layer 44 in place of the single soft wax layer 36 of the prior art of FIG. 2. By way of example, the epoxy glue layer 42 comprises a high temperature glue layer that separates at approximately 350° C. The hard wax layer 40 comprises clear mounting wax, also known as jewelers wax, that melts at about 160° C. The soft wax comprises a paraffin wax that melts at about 90° C. With the hard wax 40 supporting the device 34, there is a reduced risk of package 32 breakage from the heat created by the friction of the milling movement. Further, the epoxy glue 42 assists in keeping the hard wax 40 intact. Once the milling procedure is completed, the hard wax 42 remaining on the device is readily removed, e.g., with an acetone solvent, to achieve device 34 removal for desired device testing.

Figure 1:
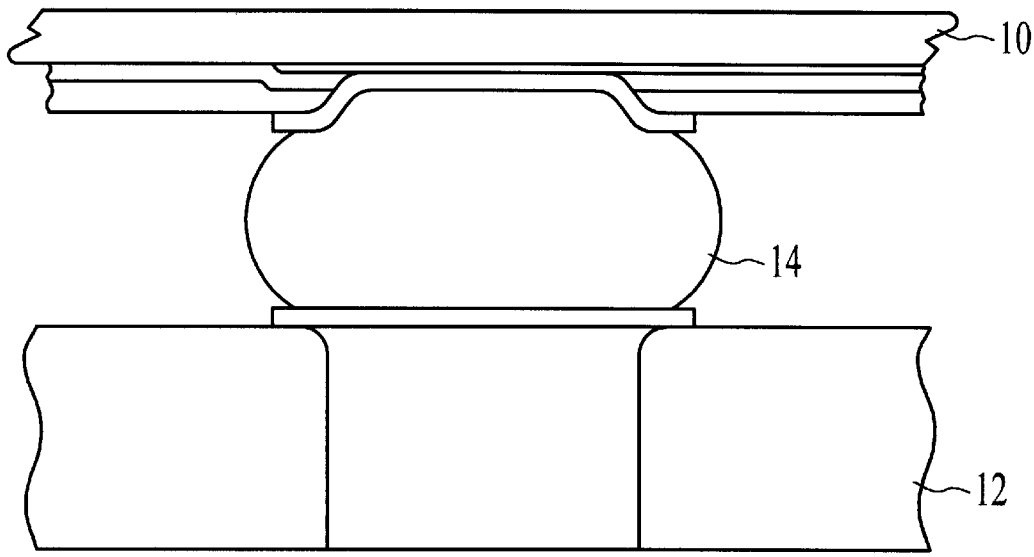
FIG. 1 illustrates a sideview diagram of a typical flip-chip multi-layer integrated circuit.
Figure 4:
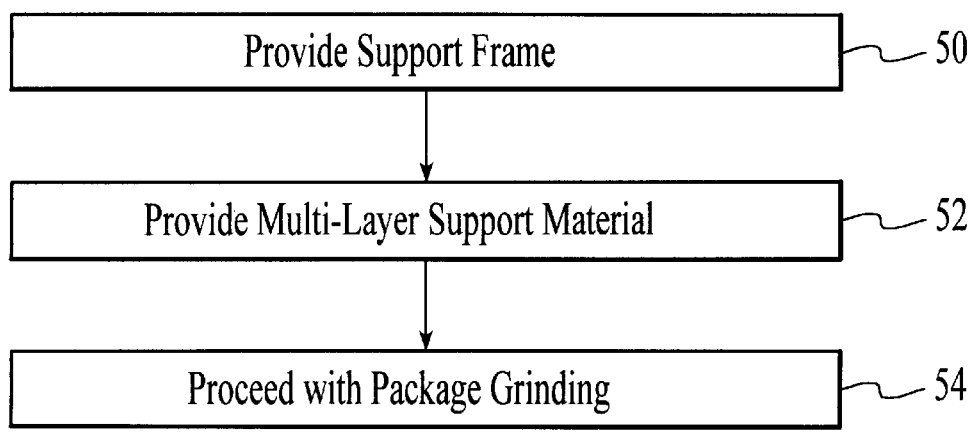
FIG. 4 illustrates a flow diagram of a technique for improving support for a device during package removal in accordance with the present invention.

FIG. 4 illustrates a flow diagram of a technique for improving support for a device during package removal. The technique includes providing a support frame (step 50), such as conventional support frame. The technique further includes providing multi-layer support material (step 52). The multi-layer support material, as described above, includes a layer of hard wax substantially covering the device. Over the layer of hard wax is an epoxy glue layer to assist in holding the hard wax intact. Between the epoxy glue layer and the support frame is a soft wax layer that substantially fills the support frame. Once the support frame and multi-layer support material are provided, any subsequent utilization of the arrangement for grinding away the package material then suitably commences (step 54).

With the improved support structure arrangement of the present invention, a reduced risk of package breakage is achieved during grinding. Greater efficiency is further achieved with the straightforward enhancement of supporting the device and package in accordance with the present invention.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A support structure for supporting a package and a device coupled to the package at a device frontside during package removal, the support structure comprising:

a support frame supporting the package substantially near end portions of the package; and multi-layer support material provided within the support frame, wherein breakage of the package during grinding of the package at its backside is reduced.

2. A support structure for supporting a package and a device coupled to the package at a device frontside during package removal, the support structure comprising:

a support frame supporting the package substantially near end portions of the package; and multi-layer support material provided within the support frame, the multi-layer support material including a hard wax layer substantially covering the device, wherein breakage of the package during grinding of the package at its backside is reduced.

3. The support structure of claim 2 wherein the multi-layer support material further comprises an epoxy glue layer substantially covering the hard wax layer.

4. The support structure of claim 3 wherein the multi-layer support material further comprises a soft wax layer substantially covering the epoxy glue layer and substantially filling remaining space within the support frame.

5. A technique for achieving support of a package and a device coupled to the package at a device frontside during package removal at a package backside, the technique comprising:

providing a support frame for supporting the package substantially near end portions of the package;

providing multi-layer support material within the support frame;

proceeding with grinding of the package for package removal, wherein potential breakage of the package is reduced.

6. A technique for achieving support of a package and a device coupled to the package at a device frontside during package removal at a package backside, the technique comprising:

providing a support frame for supporting the package substantially near end portions of the package;

providing multi-layer support material within the support frame, including providing a first layer of hard wax; and proceeding with grinding of the package for package removal, wherein potential breakage of the package is reduced.

7. The technique of claim 6 wherein the first layer of hard wax substantially covers the device.

8. The technique of claim 6 wherein providing multi-layer support material further comprises providing a second layer of an epoxy glue.

9. The technique of claim 8 wherein the epoxy glue substantially covers the hard wax.

10. The technique of claim 8 wherein providing multi-layer support material further comprises providing a third layer of a soft wax.

11. The technique of claim 10 wherein the third layer of soft wax substantially covers the epoxy glue layer and fills the support frame.

12. A system for removing a substantial portion of a ceramic package from a flip-chip device, the system comprising:

a support structure, the support structure including a support frame supporting the ceramic package substantially near end portions of the ceramic package, and multi-layer support material provided within the support frame; and a grinding tool, the grinding tool for grinding the ceramic package held by the support structure to substantially remove the ceramic package from the device, wherein the support structure reduces a risk of ceramic package breakage due to friction heat created by the grinding of the grinding tool.

13. A system for removing a substantial portion of a ceramic package from a flip-chip device, the system comprising:

a support structure, the support structure including a support frame supporting the ceramic package substantially near end portions of the ceramic package, and multi-layer support material provided within the support frame, including a hard wax layer substantially covering the device; and a grinding tool, the grinding tool for grinding the ceramic package held by the support structure to substantially remove the ceramic package from the device, wherein the support structure reduces a risk of ceramic package breakage due to friction heat created by the grinding of the grinding tool.

14. The system of claim 13 wherein the multi-layer support material of the support structure further comprises an epoxy glue layer substantially covering the hard wax layer.

15. The system of claim 14 wherein the multi-layer support material of the support structure further comprises a soft wax layer substantially covering the epoxy glue layer and substantially filling remaining space within the support frame.

* * * * *